United States Patent
Fan et al.

(10) Patent No.: US 9,466,680 B2
(45) Date of Patent: Oct. 11, 2016

(54) INTEGRATED MULTIPLE GATE LENGTH SEMICONDUCTOR DEVICE INCLUDING SELF-ALIGNED CONTACTS

(71) Applicant: GLOBALFOUNDRIES INC., Grand Cayman (KY)

(72) Inventors: Su Chen Fan, Cohoes, NY (US); Balasubramanian Pranatharthiharan, Watervliet, NY (US); Rajasekhar Venigalla, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/825,375

(22) Filed: Aug. 13, 2015

(65) Prior Publication Data

US 2015/0349075 A1 Dec. 3, 2015

Related U.S. Application Data

(62) Division of application No. 14/088,461, filed on Nov. 25, 2013, now Pat. No. 9,293,551.

(51) Int. Cl.

| | |
|---|---|
| *H01L 29/423* | (2006.01) |
| *H01L 27/092* | (2006.01) |
| *H01L 21/28* | (2006.01) |
| *H01L 29/49* | (2006.01) |
| *H01L 29/78* | (2006.01) |
| *H01L 29/10* | (2006.01) |
| *H01L 21/8238* | (2006.01) |
| *H01L 21/321* | (2006.01) |
| *H01L 21/3213* | (2006.01) |

(52) U.S. Cl.
CPC ... *H01L 29/42372* (2013.01); *H01L 21/28088* (2013.01); *H01L 21/82385* (2013.01); *H01L 21/823807* (2013.01); *H01L 27/092* (2013.01); *H01L 27/0922* (2013.01); *H01L 29/1033* (2013.01); *H01L 29/4236* (2013.01); *H01L 29/4966* (2013.01); *H01L 29/78* (2013.01); *H01L 21/3212* (2013.01); *H01L 21/32139* (2013.01)

(58) Field of Classification Search
CPC .............. H01L 21/823842; H01L 21/823437; H01L 21/823456; H01L 29/6654; H01L 29/42372; H01L 29/42376
See application file for complete search history.

(56) References Cited

U.S. PATENT DOCUMENTS

| | | |
|---|---|---|
| 6,406,962 B1 | 6/2002 | Agnello et al. |
| 6,607,950 B2 | 8/2003 | Henson et al. |
| 6,707,079 B2 | 3/2004 | Satoh et al. |
| 7,214,994 B2 | 5/2007 | Forbes et al. |
| 8,298,895 B1 | 10/2012 | Alptekin |
| 2012/0181630 A1 | 7/2012 | Ando et al. |
| 2013/0280900 A1 | 10/2013 | Lai et al. |
| 2013/0302974 A1 | 11/2013 | Hahn et al. |
| 2014/0008720 A1 | 1/2014 | Xie et al. |

*Primary Examiner* — Tucker J Wright
(74) *Attorney, Agent, or Firm* — Yuanmin Cai, Esq.

(57) ABSTRACT

A multi-channel semiconductor device includes a first and second gate channels formed in a semiconductor substrate. The first gate channel has a first length and the second gate channel has a second length greater than the first length. A gate dielectric layer is formed in the first and second gate channels. A first plurality of work function metal layers is formed on the gate dielectric layer of the first gate channel. A second plurality of work function metal layers is formed on the gate dielectric layer of the second gate channel. A barrier layer is formed on each of the first and second plurality of work function metal layers, and the gate dielectric layer. The multi-channel semiconductor device further includes metal gate stacks formed on of the barrier layer such that the barrier layer is interposed between the metal gate stacks and the gate dielectric layer.

17 Claims, 20 Drawing Sheets

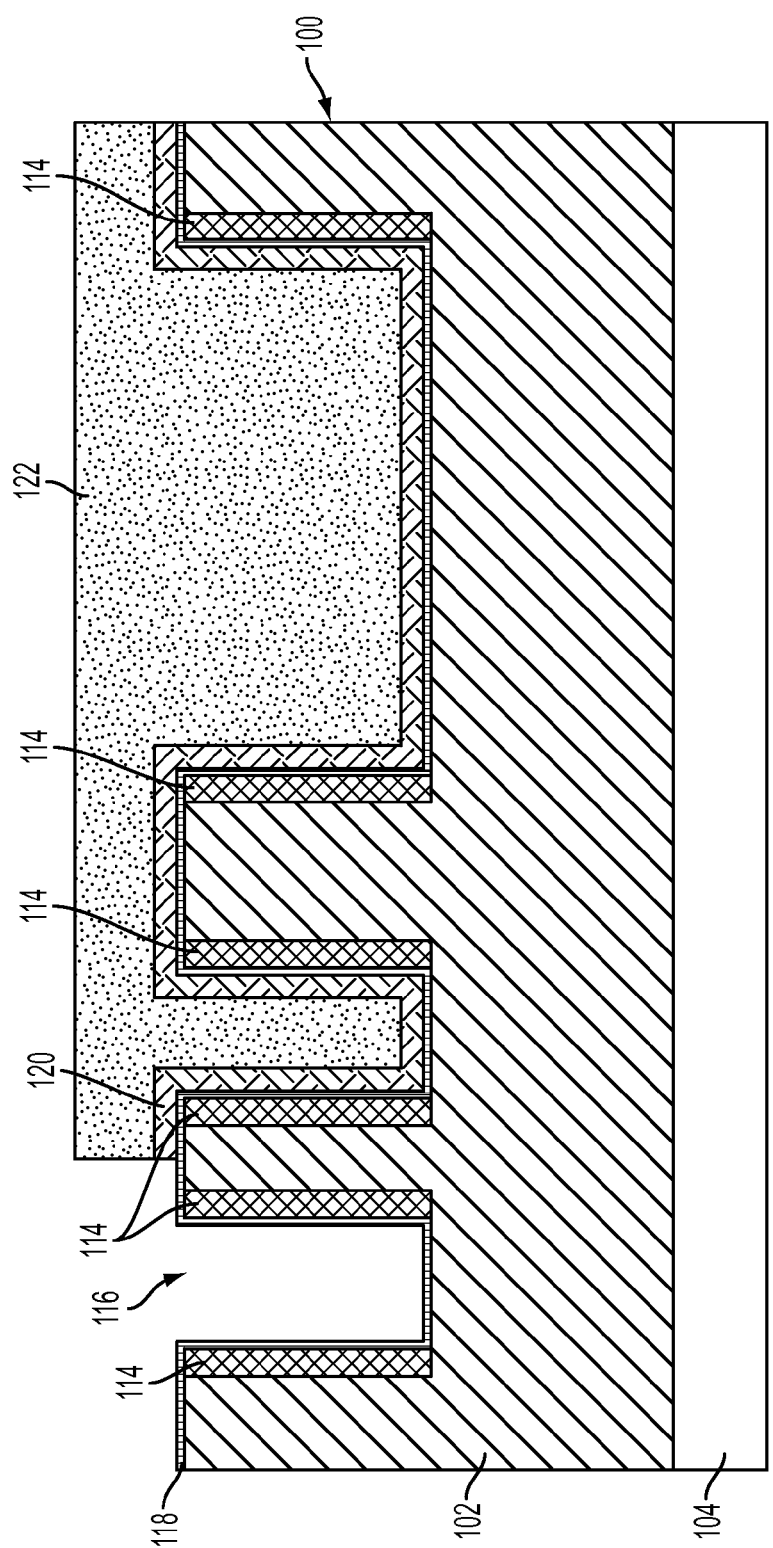
FIG. 5
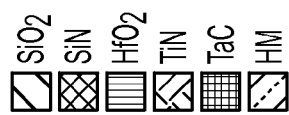

US 9,466,680 B2

INTEGRATED MULTIPLE GATE LENGTH SEMICONDUCTOR DEVICE INCLUDING SELF-ALIGNED CONTACTS

DOMESTIC PRIORITY

This application is a divisional of U.S. patent application Ser. No. 14/088,461, filed Nov. 25, 2013, the disclosure of which is incorporated by reference herein in its entirety.

BACKGROUND

The present invention relates to semiconductor device fabrication, and more particularly, to a variable length, multi-channel semiconductor including self-aligned metal gate stacks.

Recent trends have turned to low-resistive metals as a desired material to form semiconductor device gate stacks. The electrical resistivity of tungsten (W) gate stacks, for example, has shown to be as much as one-hundred times lower than comparably sized doped polysilicon gate stacks. In addition, the larger work function of tungsten and other low-resistive metals produces low and nearly symmetrical threshold voltages for both PMOS and NMOS devices on moderately doped substrates. Accordingly, tungsten and other low-resistive metals are attractive as a gate stack material in CMOS circuit design. Tungsten, for example, has also exhibited the potential to reduce sub-threshold leakage currents and decrease sensitivity to body bias as compared to conventional doped polysilicon gate stacks.

Various semiconductor structures include gate channel regions having varying lengths. For example, CMOS semiconductor devices may include both a narrow gate channel region and a long gate channel region. The long gate channel region, however, may be susceptible to etch loading effects when simultaneously etching the narrow gate channel region. This may cause the long gate channel region to be etched more quickly when simultaneously etching the narrow gate channel region, thereby forming non-uniform gate stacks. Therefore, an additional masking layer is typically required during the fabrication process to protect the long gate channel region from etch loading effects.

SUMMARY

According to at least one embodiment a method of fabricating a multi-gate semiconductor device comprises forming a first gate void in a semiconductor substrate and a second gate void in the semiconductor substrate. The first gate void has a first length and the second gate void has a second length greater than the first length. The method further comprises forming a gate dielectric layer in the first and second gate voids. The method further comprises forming a first plurality of work function metal layers on the gate dielectric layer of the first gate void and forming a second plurality of work function metal layers on the gate dielectric layer of the second gate void. The method further comprises etching the first plurality of work function metal layers to form a first gate cavity and etching the second plurality of work function metal layers to form a second gate cavity. The method further comprises forming a barrier layer in the first and second gate cavities. The method further comprises forming metal gate stacks in the first and second cavities on an exposed surface of the barrier layer.

According to another embodiment, a multi-channel semiconductor device comprises a first gate channel formed in a semiconductor substrate and a second gate channel formed in the semiconductor substrate. The first gate channel has a first length and the second gate channel has a second length greater than the first length. A gate dielectric layer is formed in the first and second gate channels. A first plurality of work function metal layers is formed on the gate dielectric layer of the first gate channel. A second plurality of work function metal layers is formed on the gate dielectric layer of the second gate channel. A barrier layer is formed on each of the first and second plurality of work function metal layers, and the gate dielectric layer. The multi-channel semiconductor device further includes metal gate stacks formed on the barrier layer such that the barrier layer is interposed between the metal gate stacks and the gate dielectric layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIG. 5 illustrates the semiconductor substrate of FIG. 4 following removal of the first conformal work function metal layer from the gate void and upper surfaces corresponding to the first semiconductor structure;

DETAILED DESCRIPTION

Figure 1:
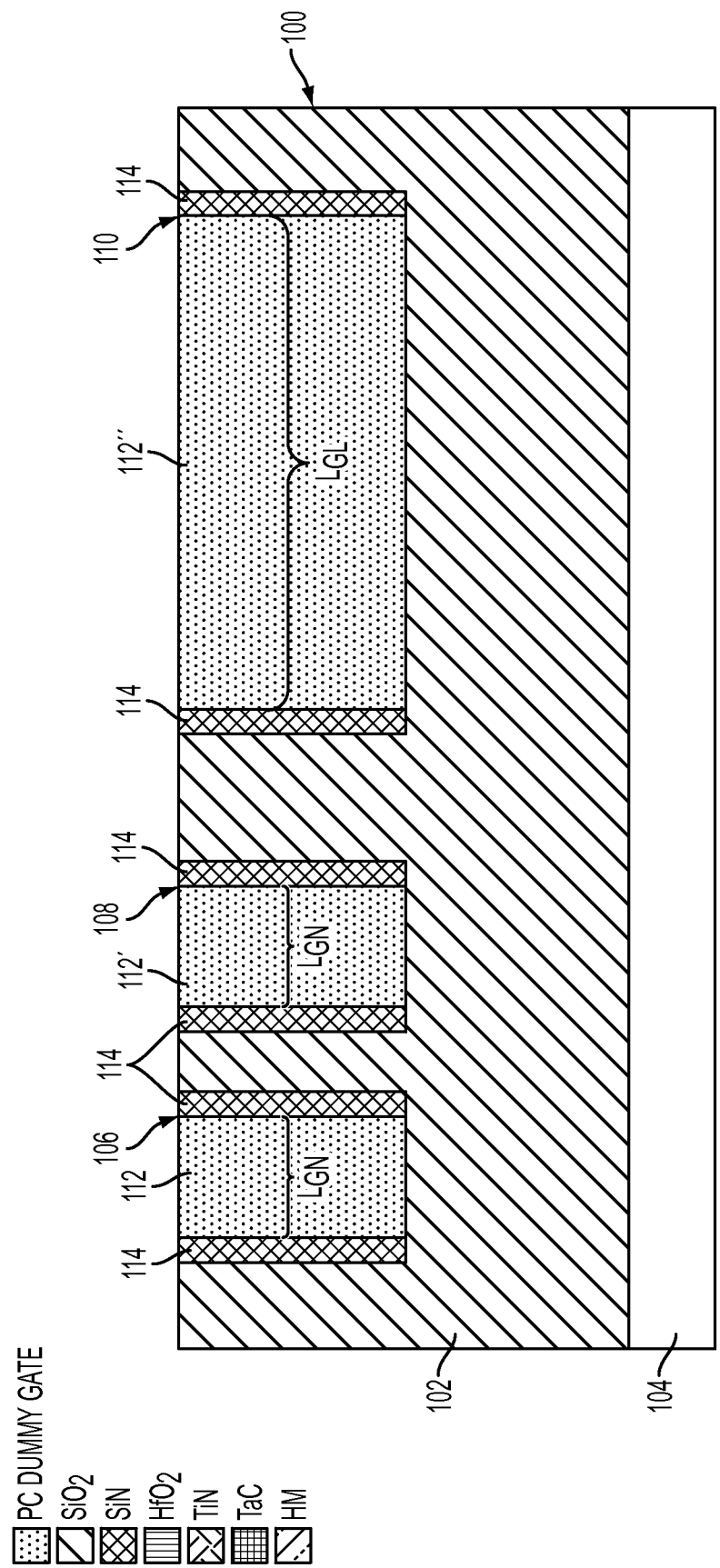
FIG. 1 is a cross-sectional view of a semiconductor substrate including first and second semiconductor structures having a narrow gate channel defined by respective narrow dummy gate stacks and third semiconductor structure having a long gate channel defined by a long dummy gate stack.

With reference now to FIG. 1, a semiconductor substrate 100 is illustrated which may be used to fabricate a multi-channel variable gate-length semiconductor device according to an exemplary embodiment of the disclosure. The semiconductor substrate 100 may be used to form various semiconductor transistor structures including, but not limited to, a planar transistor, a three-dimensional (3D) transistor (e.g., a FinFET transistor), and a nanowire transistor.

The semiconductor substrate 100 includes an insulator layer 102 formed on an upper surface of a bulk substrate 104 to form a semiconductor-on-insulator (SOI) substrate 100. Although a SOI substrate 100 is described going forward, a bulk substrate 104 formed from silicon (Si), for example, may be used as the semiconductor substrate 100 as understood by those ordinarily skilled in the art. The insulator layer 102 may be formed from, for example, silicon oxide ($SiO_2$), and the bulk substrate 104 may be formed from, for example, silicon (Si).

The semiconductor substrate 100 may further include a first semiconductor structure 106, a second semiconductor structure 108, and a third semiconductor structure 110. The first semiconductor structure 106 and the second semiconductor structure 108 each have a narrow gate channel defined by a respective narrow dummy gate stack 112/112'. The third semiconductor structure 110 has a long gate channel defined by a long dummy gate stack 112". The first, second and third semiconductor structures 106-110 may further include spacers 114 formed on opposing sidewalls of the dummy gate stacks 112-112". The spacers 114 may be formed from silicon nitride (SiN), for example.

Still referring to FIG. 1, the first semiconductor structure 106 may be formed as an N-type field effect transistor (NFET) (hereinafter referred to as a narrow NFET 106), and the second semiconductor structure 108 may be formed as a first P-type field effect transistor (PFET) (hereinafter referred to as a narrow PFET 108). The third semiconductor structure may be formed as a PFET (hereinafter referred to as a long PFET 110) having a channel length ($L_{GL}$) that is greater than the channel length ($L_{GN}$) of the narrow NFET 106 and the narrow PFET 108. It is appreciated, however, that the semiconductor substrate 100 is not limited to the structures and arrangements of FETs illustrated in FIG. 1. For instance, the third semiconductor structure 110 may be formed as a long NFET as understood by those ordinarily skilled in the art. The channel length of the narrow NFET 106 and narrow PFET 108 is, for example, less than approximately 25 nanometers (nm). The channel length of the long PFET 110 ranges, for example, from approximately 50 nm to approximately 1 micrometer (μm).

Figure 2:
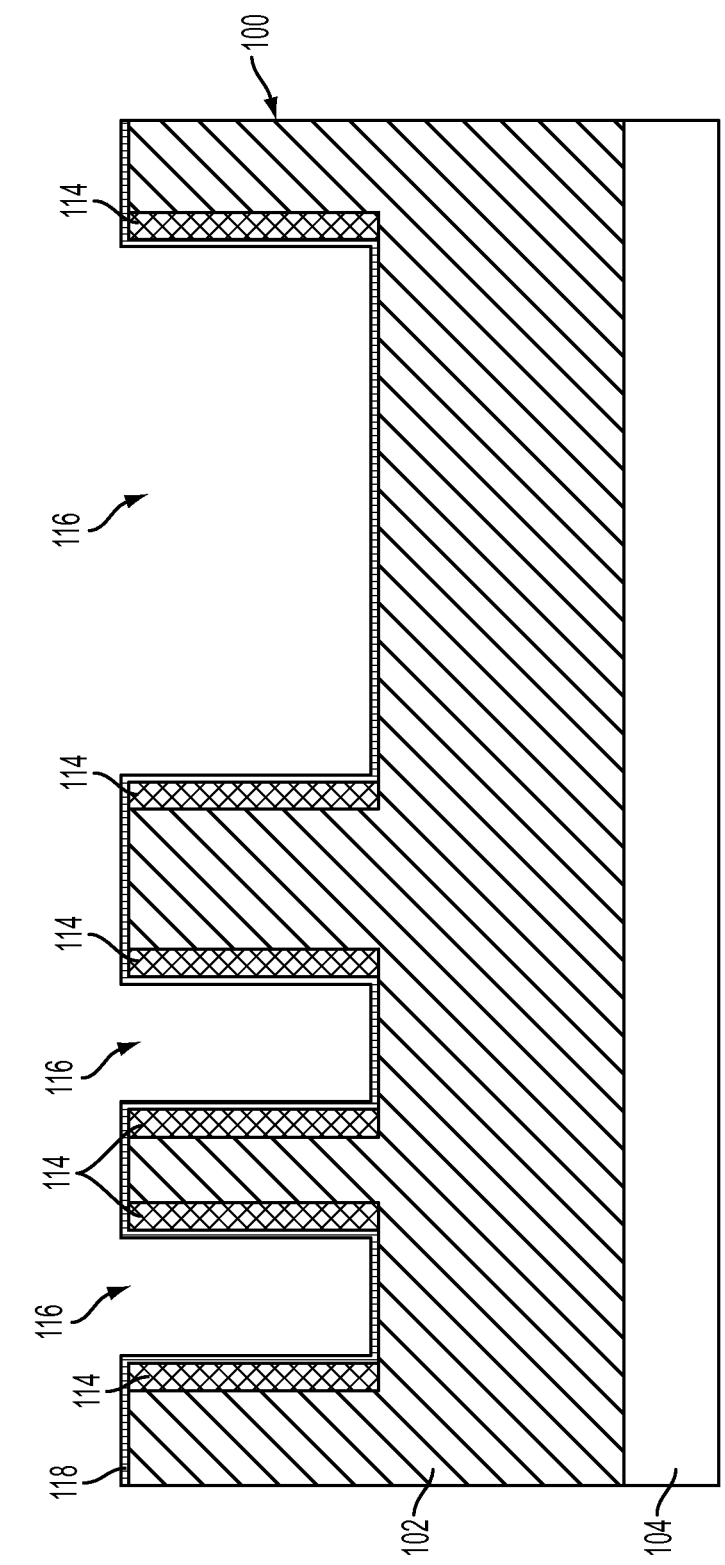
FIG. 2 illustrates the semiconductor substrate of FIG. 1 after removing the dummy gate stacks to form respective gate voids and after depositing a thin conformal gate dielectric layer on the sidewalls and base of the gate voids.

Referring now to FIG. 2, the semiconductor substrate 100 is illustrated having gate voids 116 after removing the dummy gate stacks 112-112". A thin conformal gate dielectric layer 118 may then be deposited on the sidewalls and base of the gate voids 116 as further illustrated in FIG. 2. According to at least one exemplary embodiment, the gate dielectric layer 118 is formed from, for example, hafnium oxide ($HfO_2$). The gate dielectric layer 118 may be deposited according to various methods including, but not limited to, chemical vapor deposition (CVD).

Figure 3:
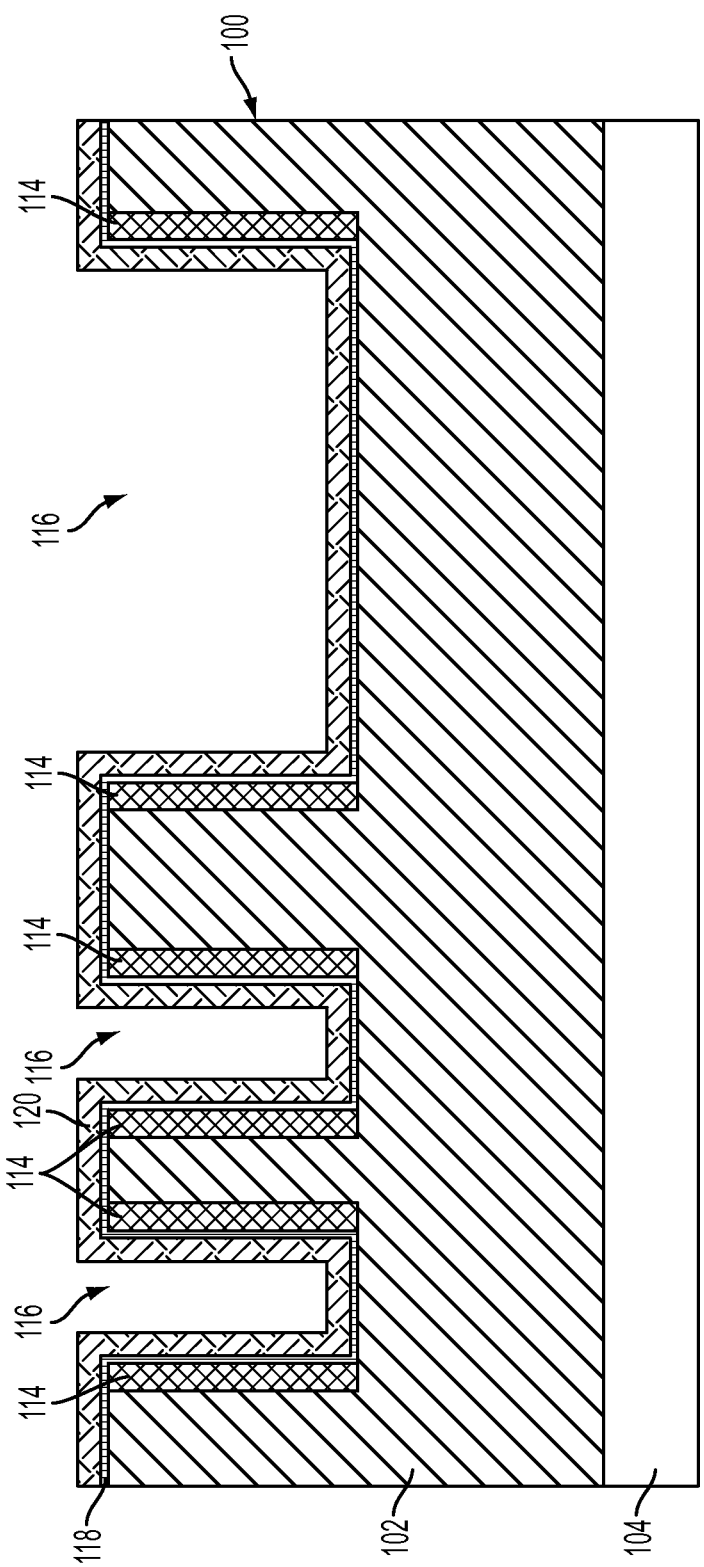
FIG. 3 illustrates the semiconductor substrate of FIG. 2 following a deposition of a first conformal work function metal layer on an upper surface of the gate dielectric layer.

Turning to FIG. 3, a first conformal work function metal (WFM) layer 120 is deposited on an upper surface of the gate dielectric layer 118. The first conformal WFM layer 120 is formed from, for example, titanium nitride (TiN). The first conformal WFM layer 120 may be deposited according to various methods including, but not limited to, atomic layer deposition (ALD).

Figure 4:
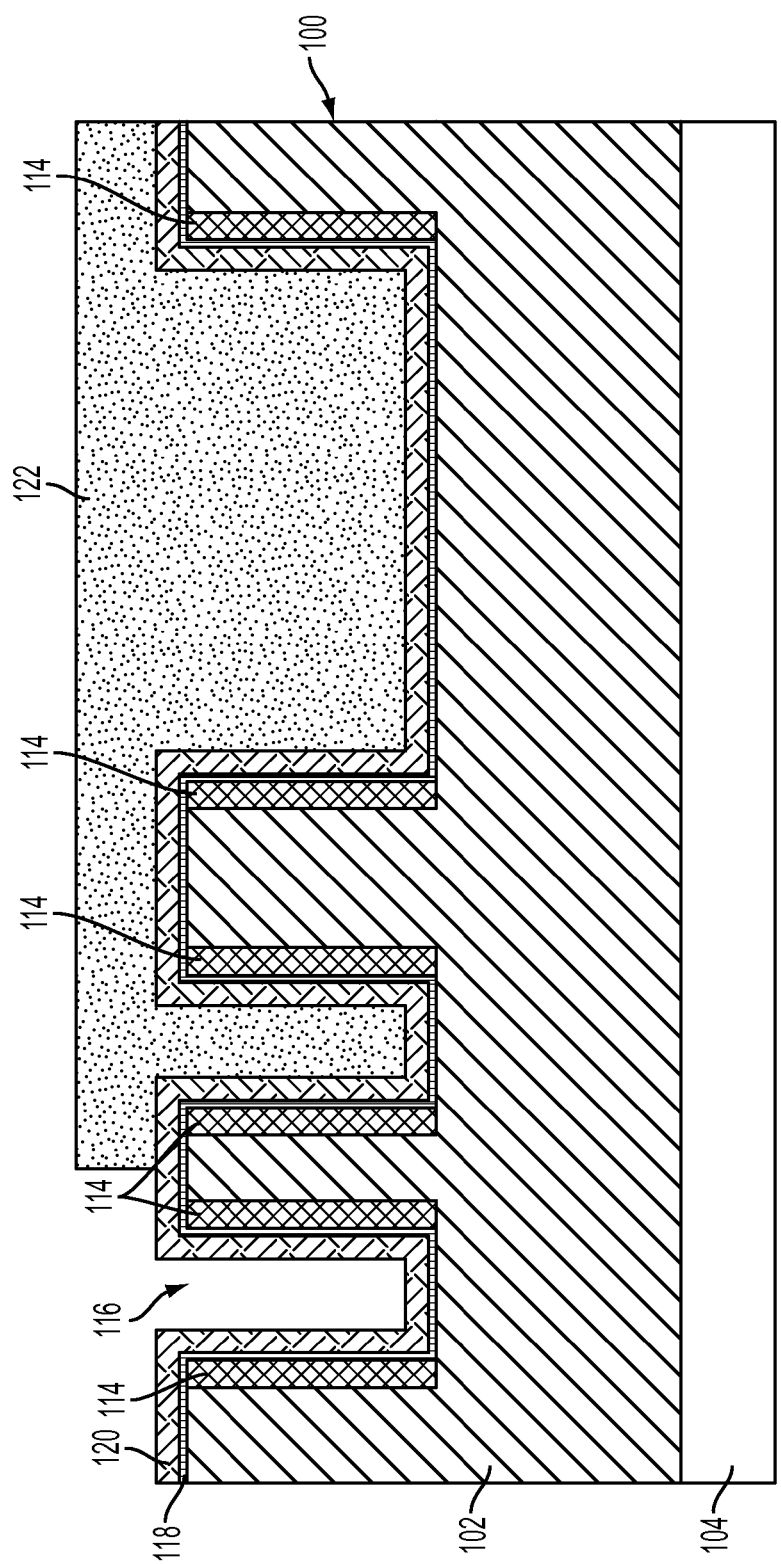
FIG. 4 illustrates the semiconductor substrate of FIG. 3 following deposition of a block masking layer in the gate voids and on upper surfaces of the first conformal work function metal layer, and after patterning of the block masking layer to expose a gate void and a portion of the first conformal work function metal layer corresponding to the first semiconductor structure.

Turning now to FIG. 4, a block masking layer 122 is deposited on the gate voids 116 and the upper surfaces of the first conformal WFM layer 120. The block masking layer 122 may be patterned using well-known patterning methods to expose a portion of the first conformal WFM layer 120 corresponding to the gate void 116 of the narrow NFET 106.

Figure 6:
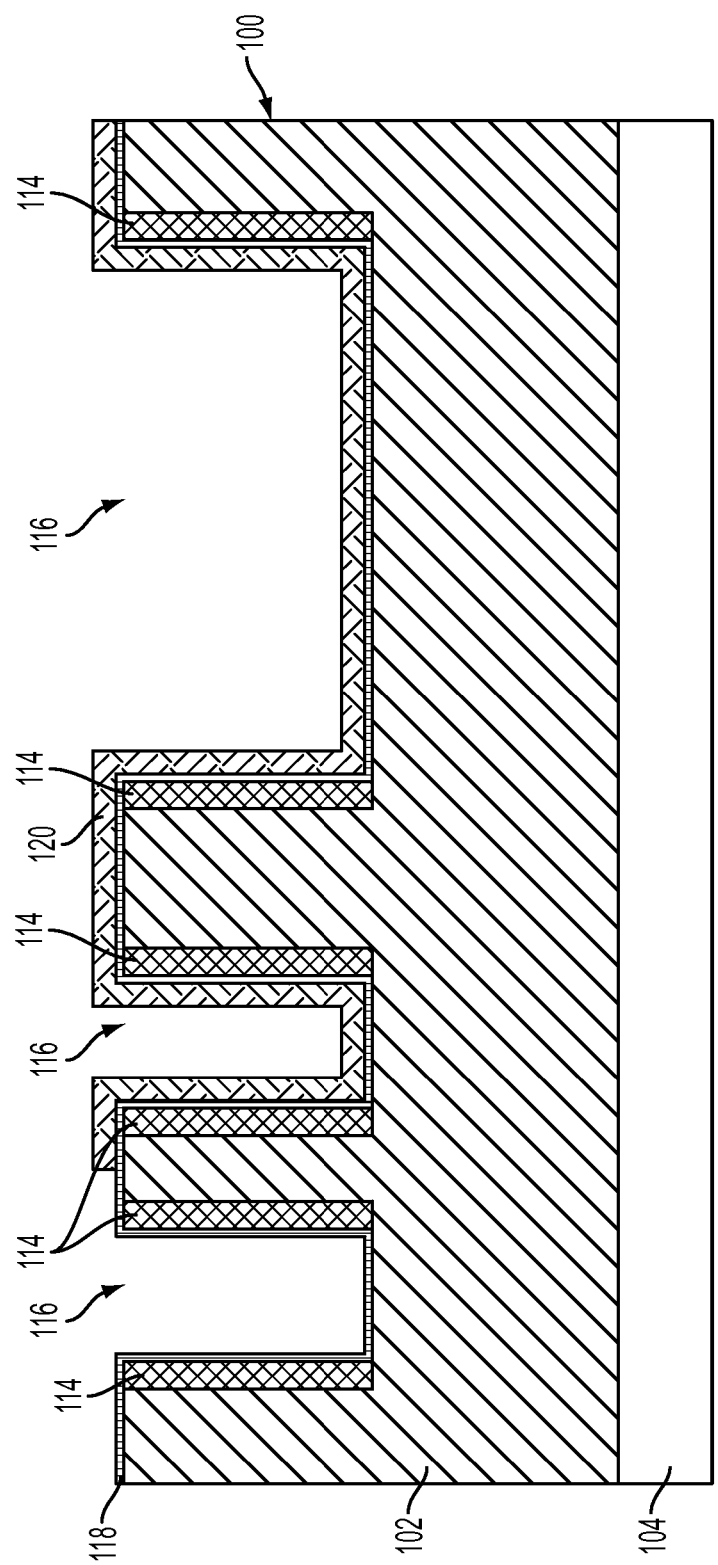
FIG. 6 illustrates the semiconductor substrate of FIG. 5 following removal of the block masking layer to expose a remaining portion of the first conformal work function metal layer.

Referring to FIG. 5, the exposed portion of the first conformal WFM layer 120 is removed to re-expose the underlying gate dielectric layer 118. Various etching methods that are selective to oxide materials may be used as understood by those ordinarily skilled in the art. Accordingly, the exposed portion of the first conformal WFM layer 120 may be removed while maintaining the underlying gate dielectric layer 118 on the sides of the gate void 116 and on upper surfaces of the semiconductor substrate 100. After removing the first conformal WFM layer 120, the block masking layer 122 may be removed to expose the remaining portion of the first conformal WFM layer 120 on the upper surface of the semiconductor substrate 100 and in the gate voids 116 of the narrow PFET 108 and the long PFET 110 as illustrated in FIG. 6.

Figure 7:
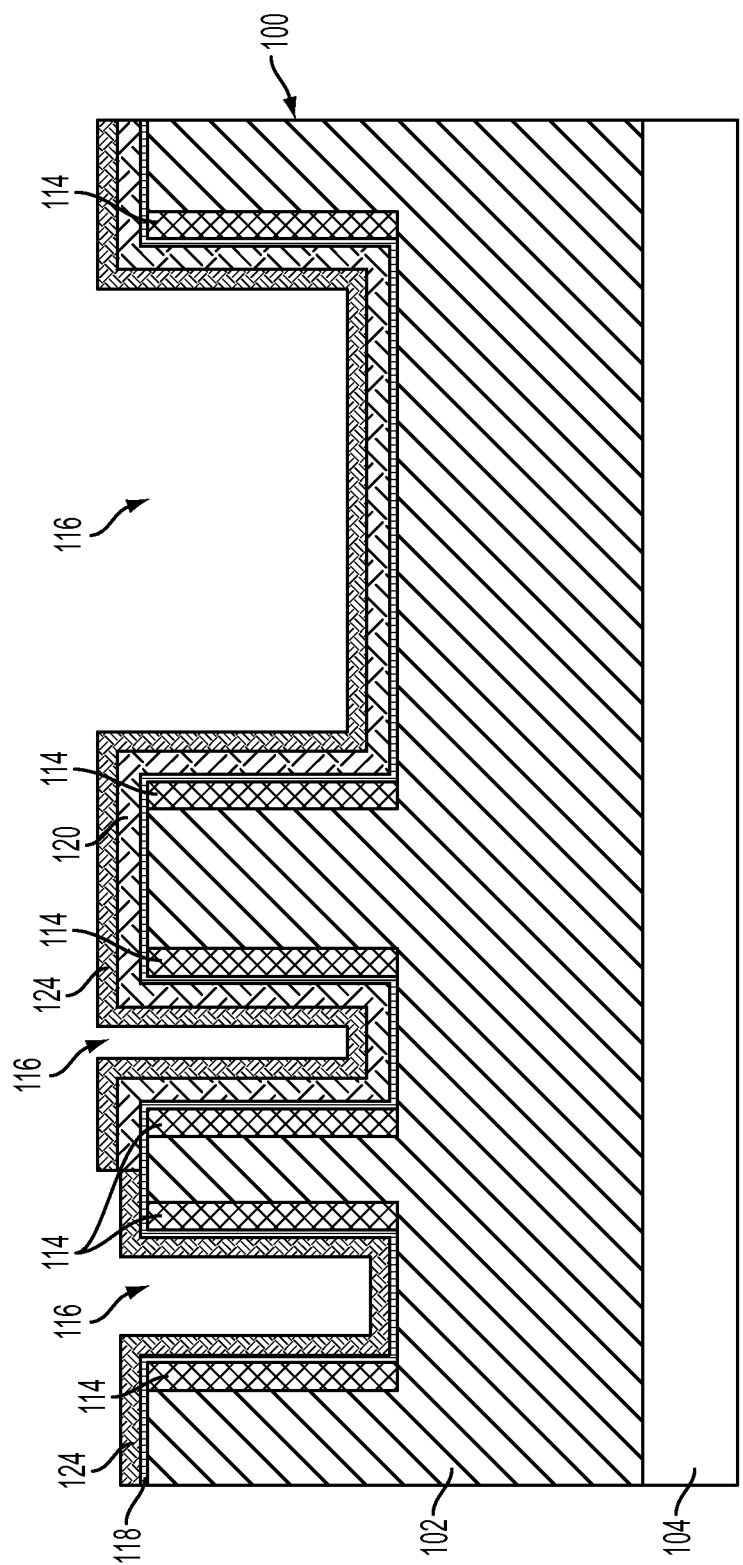
FIG. 7 illustrates the semiconductor substrate of FIG. 6 following a deposition of a second conformal work function metal layer in the gate voids and on upper surfaces of the first conformal work function metal layer.

Referring now to FIG. 7, a second conformal WFM layer 124 is deposited on the upper surface of the semiconductor substrate 100 and in the gate voids 116 of the narrow NFET 106, the narrow PFET 108, and the long PFET 110. In regard to the narrow NFET 106, the second conformal WFM layer 124 is deposited on an upper surface of the gate dielectric layer 118 which is formed on sidewalls of the gate void 116 and upper surfaces of the semiconductor substrate 100. In regard to the narrow PFET 108 and the long PFET 110, the second conformal WFM layer 124 is deposited on an upper surface of the first conformal WFM layer 124 which is formed on sidewalls of the gate voids 116 and upper surfaces of the semiconductor substrate 100. Accordingly, the combined first and second WFM layers 120 and 124 corresponding to the narrow PFET 108 and the long PFET 110 define a thickness that is greater than the thickness of the second conformal WFM layer 124 corresponding to the narrow NFET 106. According to at least one embodiment, the first and second WFM layers 120 and 124 may be formed from the same material including, but not limited to, TiN. Various methods may be used to deposit the second conformal WFM layer 124 including, but not limited to, ALD. According to at least one embodiment, the second WFM layer 124 formed in the gate void 116 of the narrow NFET 106 is formed directly on the surface of the gate dielectric layer 118, while the second WFM layer 124 formed in the gate void 116 of the narrow PFET 108 and/or long PFET 110 is formed directly on a surface of the first WFM layer 120.

Figure 8:
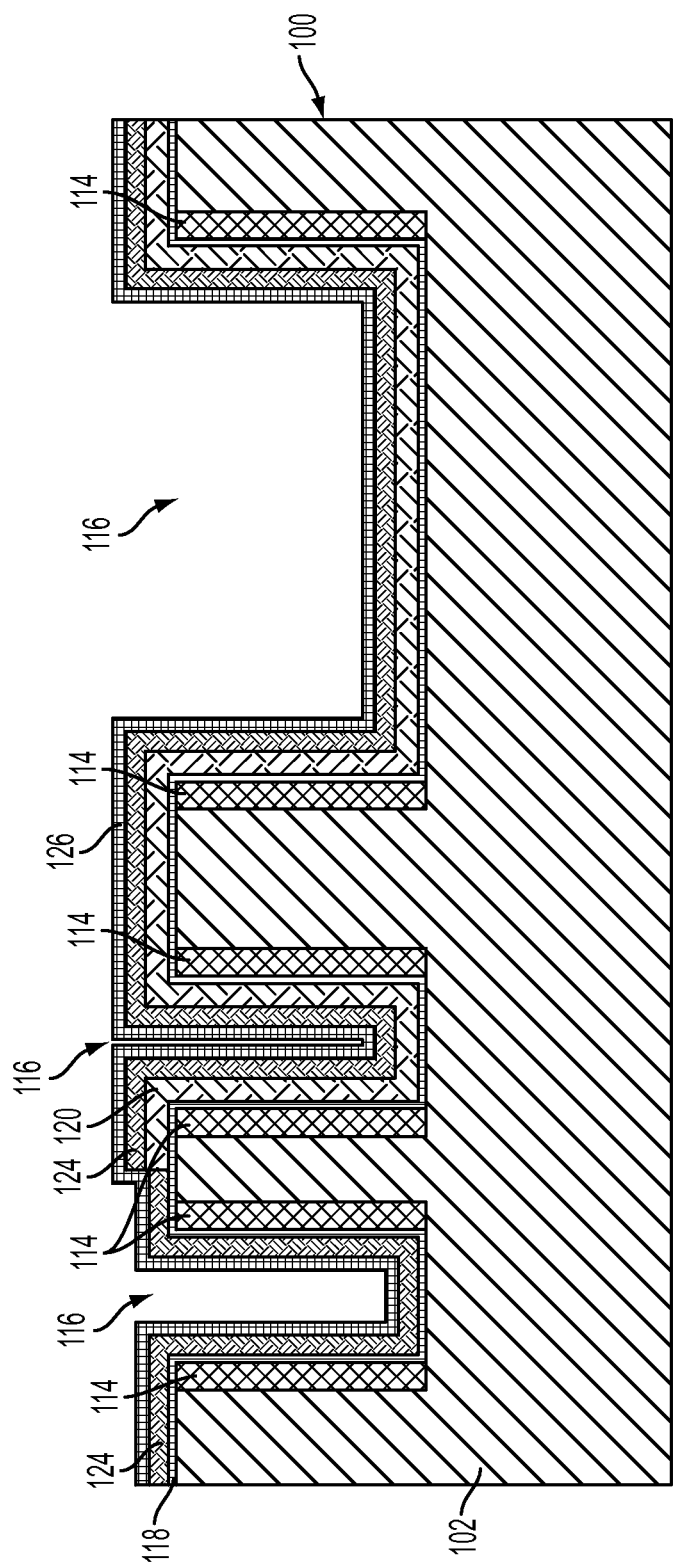
FIG. 8 illustrates the semiconductor substrate of FIG. 7 following a deposition of a third conformal work function metal layer in the gate voids and on upper surfaces of the second conformal work function metal layer.

Turning now to FIG. 8, a third conformal WFM layer 126 is deposited on an upper surface of the second conformal WFM layer 124 and in the gate voids 116 corresponding to the narrow NFET 106, the narrow PFET 108 and the long PFET 110. The third conformal WFM layer 126 may be formed from a different metal than the underlying second conformal WFM layer 124. For example, the third conformal WFM layer 126 may be formed from various metals including, but not limited to tantalum carbide (TaC) and titanium carbide (TiC). In this regard, the thickness of the third conformal WFM layer 126 corresponding to the narrow NFET 106 is greater than the thickness of the second conformal WFM layer 124. The thickness of the third conformal WFM layer 126 corresponding to the narrow PFET 108 and the long PFET 110, however, may be less than the thickness of the combined first and second WFM layers 120 and 124. According to at least one exemplary embodiment, the thickness of the third conformal WFM layer 126 may range from approximately 0.5 nm to 10 nm, the thickness of the second conformal WFM layer 124 corresponding to the narrow NFET 106 may range from approximately 0.5 nm to approximately 3 nm, and the combined thickness of the second conformal WFM layer 124 corresponding to the narrow PFET 108 and the long PFET 110 may range from approximately 5 nm to approximately 10 nm. According to at least one embodiment where the third conformal WFM layer 126 is formed from TaC or TiC, the second conformal WFM layer 124 may inhibit the TaC or TiC material from intermixing with the material of the gate dielectric layer 118. Accordingly, the work function metal properties of the third conformal WFM layer 126 may be preserved.

Figure 9:
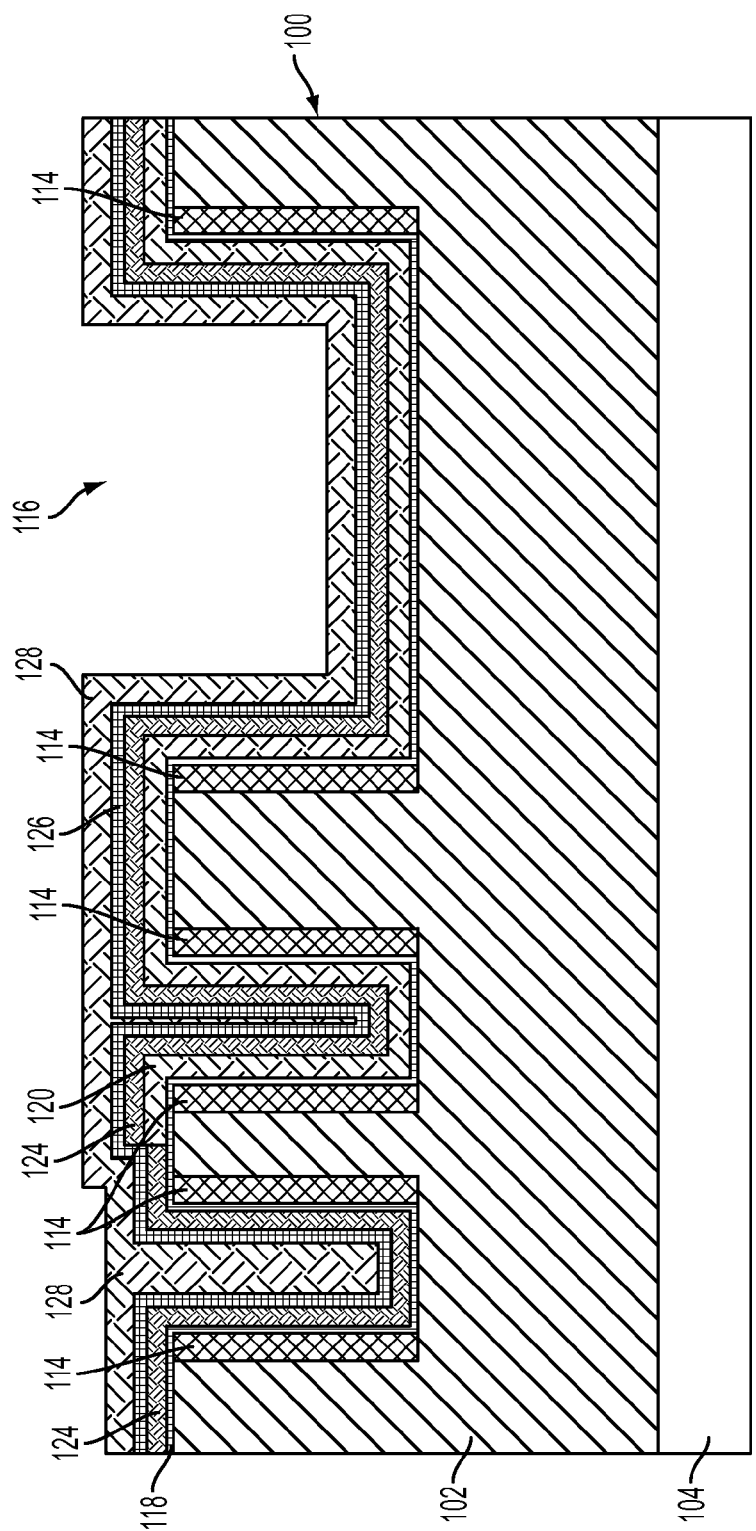
FIG. 9 illustrates the semiconductor substrate of FIG. 8 following deposition of the fourth conformal work function metal layer in the gate voids and on upper surfaces of the second conformal work function metal layer to form a combined work function metal layer.

Referring now to FIG. 9, a fourth conformal WFM layer 128 is deposited on an upper surface of the third conformal WFM layer 126. The fourth conformal WFM layer 128 may be formed from a different metal than the underlying third conformal WFM layer 126. For example, the fourth conformal WFM layer 128 may be formed from various metals including, but not limited to, TiN. According to at least one embodiment, the fourth conformal WFM layer 128 fills the gate voids 116 corresponding to the narrow NFET 106 and the narrow PFET 108. Further, the combined thickness of the first, second, third and fourth conformal WFM layers 120, 124, 126, and 128 (i.e., the PFET WFM layers) corresponding to the narrow PFET 108 and the long PFET 110 is greater than the combined thickness of the second, third, and fourth conformal WFM layers 124, 126, and 128 (i.e., the NFET WFM layers) corresponding to the narrow NFET 106. Accordingly, the upper surface of the PFET WFM layers extends beyond the upper surface of the NFET WFM layers. That is, the PFET WFM layers are not formed flush with NFET WFM layers.

Figure 10:
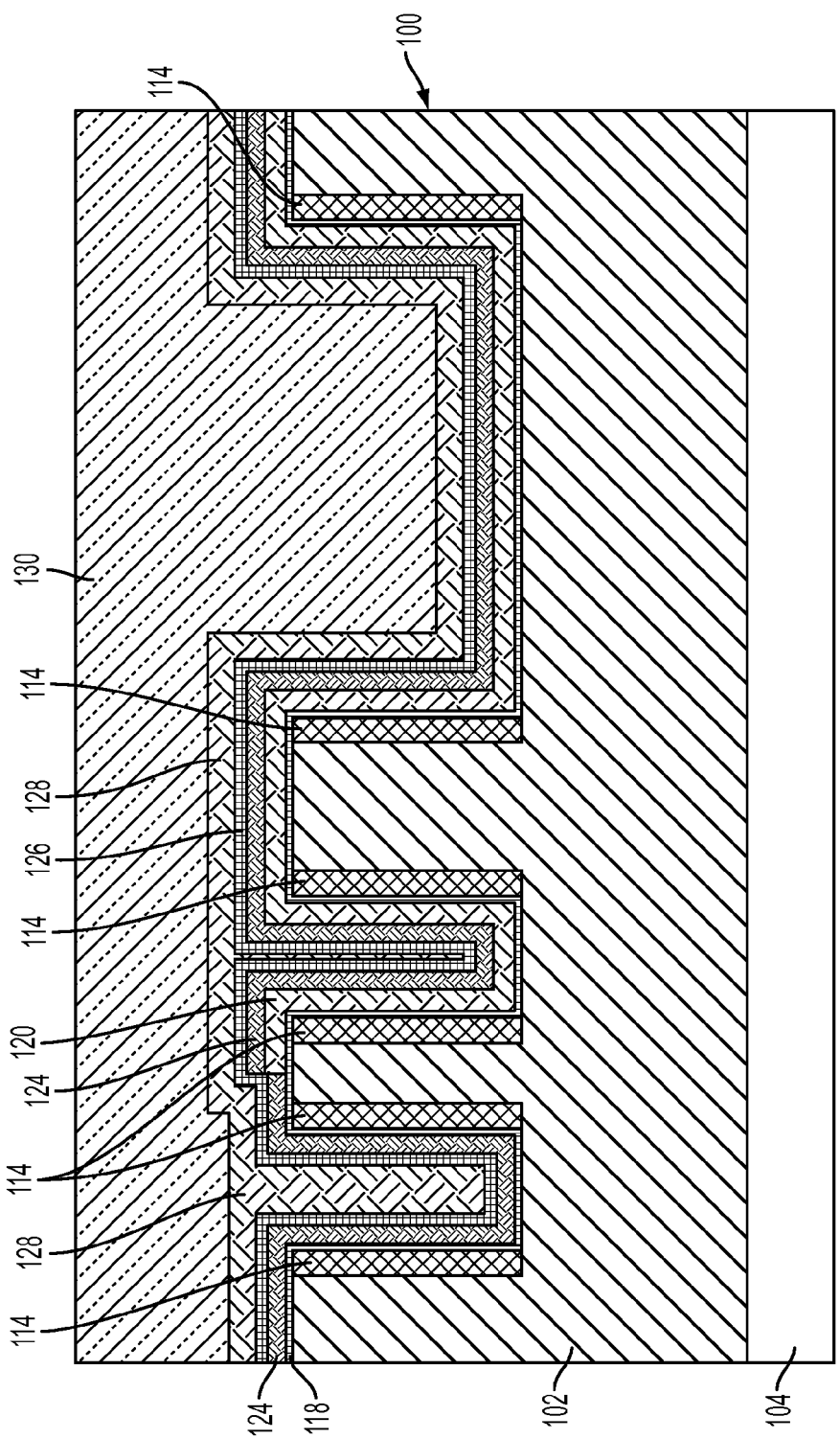
FIG. 10 illustrates the semiconductor substrate of FIG. 9 following deposition of a block oxide layer in the gate voids and on an upper surface of the combined work function metal layer.

Referring to FIG. 10, a block hard mask layer 130 is deposited in the gate void 116 of the long PFET 110 and on the upper surface of the combined NFET WFM layers and the combined PFET WFM layers. The block hard mask layer 130 may be formed from various materials including, but not limited to, SiO₂. Various methods for depositing the block hard mask layer 130 may be used including, but not limited to, a CVD process.

Figure 11:
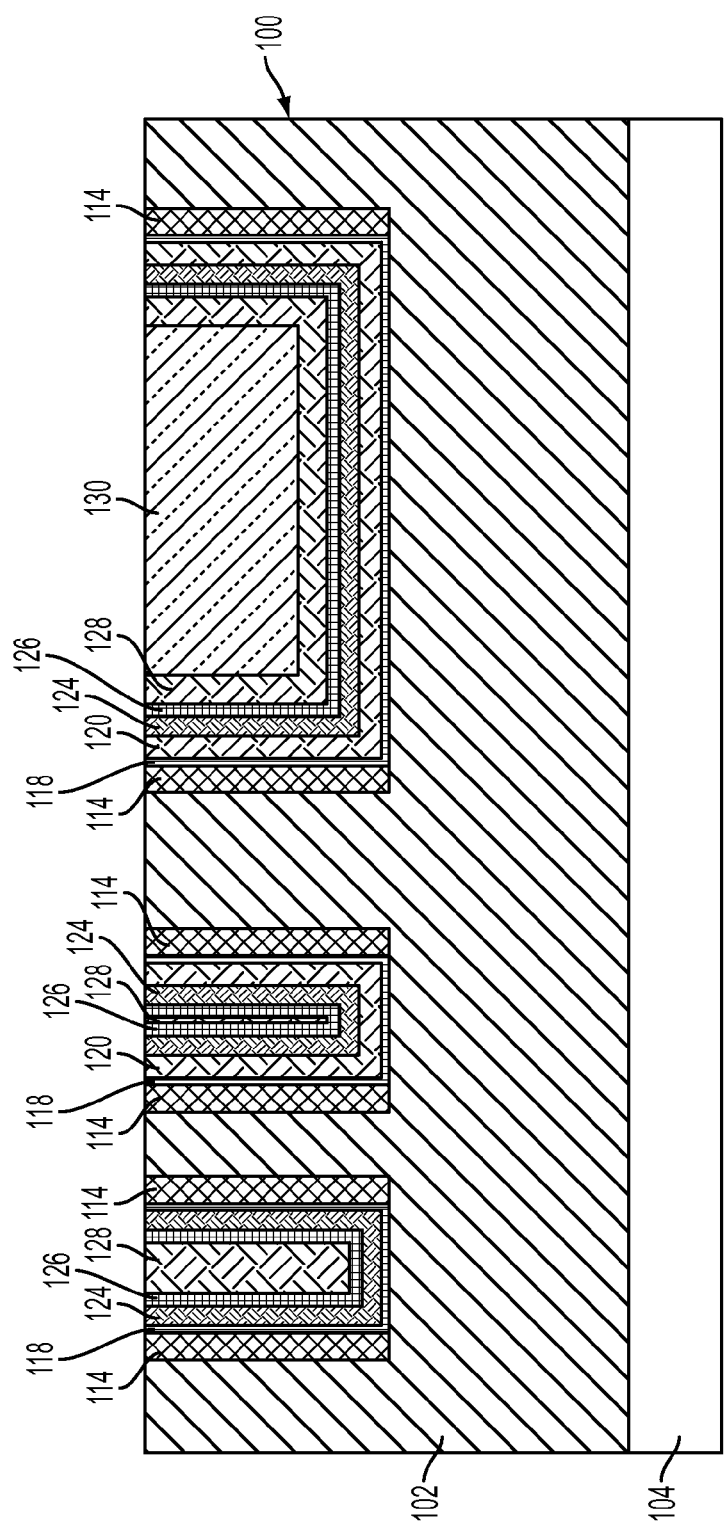
FIG. 11 illustrates the semiconductor substrate of FIG. 10 following a planarization process that removes portions of the block oxide layer, the combined work function metal layer, and the gate dielectric layer from the upper surface of the semiconductor substrate.

Referring to FIG. 11, the semiconductor substrate 100 is planarized such that the block hard mask layer 130 formed on the narrow NFET 106 and narrow PFET 108 is removed, while a portion of the hard mask 131 remains filling the gate void 116 of the long PFET 110. Accordingly, the upper surfaces of the narrow NFET 106, the narrow PFET 108 and the long PFET 110 are flush with the upper surface of the semiconductor substrate 100.

Figure 12:
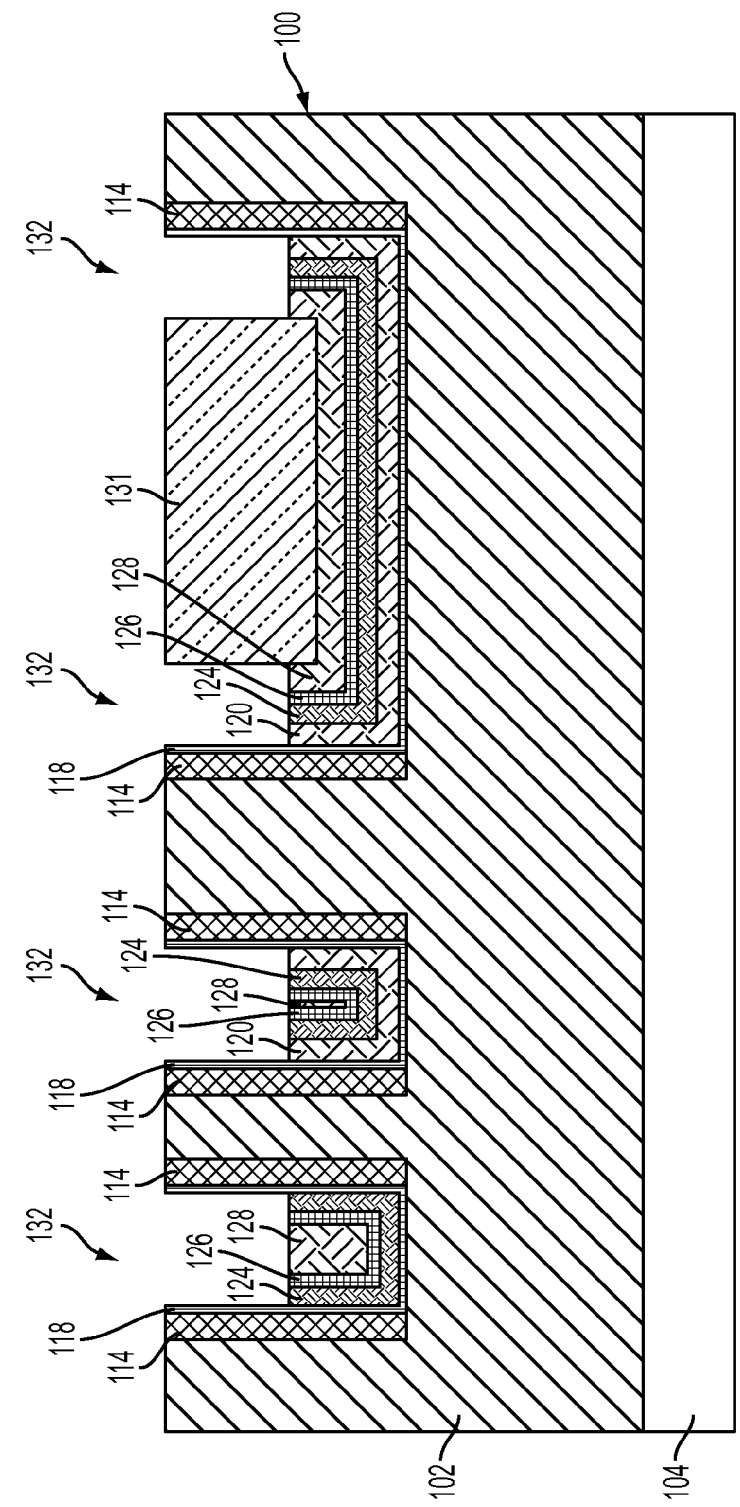
FIG. 12 illustrates the semiconductor substrate of FIG. 11 after etching portions the combined work function metal layer formed in each of the narrow gate channels and the long gate channel.
Figure 12:
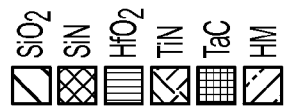

Turning to FIG. 12, a portion of the combined NFET WFM layers and the combined PFET WFM layers are etched. A dry or wet etching process that is selective to oxide materials may be used. In this regard, an additional masking layer for covering the long channel (e.g., the long PFET 110) is unnecessary. That is, at least one exemplary embodiment differs from the conventional process flow in that a separate masking layer is not used to cover both the combined PFET WFM layers of the long PFET 110 and the hard mask 131 corresponding to the long PFET 110. Accordingly, the combined NFET WFM layers and combined PFET WFM layers are partially recessed such that cavities 132 are formed in the gate channel regions of narrow NFET 106, the narrow PFET 108 and the long PFET 110, which expose the gate dielectric layer 118. Regarding the long PFET 110, the cavities 132 are formed between the gate dielectric layer 118 and the hard mask 131. Since no additional masking layer (as used by the conventional process flow) covers the long PFET 110, the cavities 132 in the gate channel regions of the narrow NFET 106, the narrow PFET 108 and the long PFET 110 may be formed simultaneously.

Figure 13:
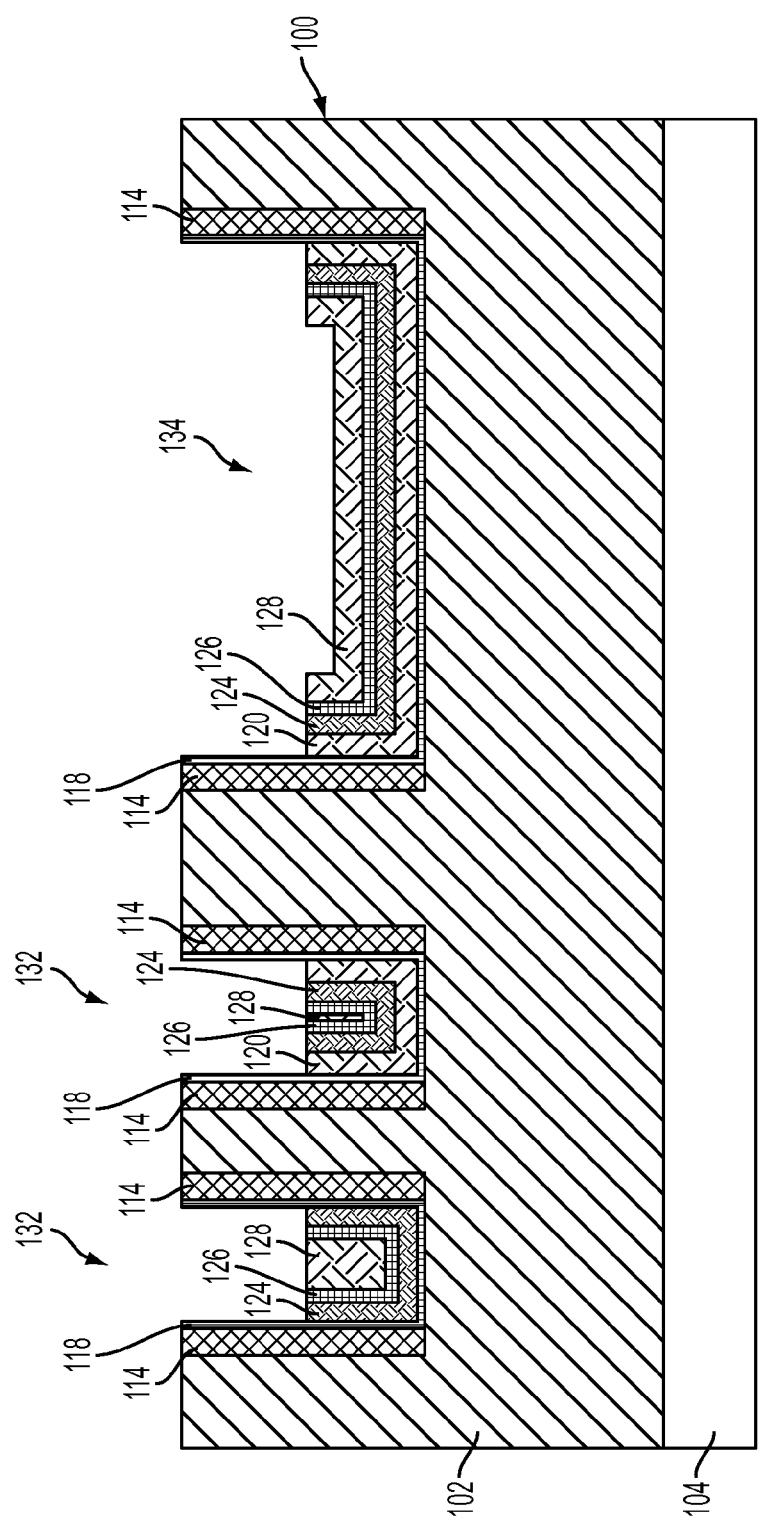
FIG. 13 illustrates the semiconductor substrate of FIG. 12 after removing a remaining portion of the block oxide layer from the long gate channel.
Figure 13:
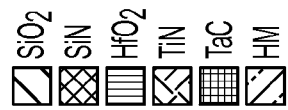

As illustrated in FIG. 13, the hard mask 131 may then be removed using various etching processes that are selective to the combined PFET WFM layers and the gate dielectric layer 118. Accordingly, a trench 134 is formed in the combined PFET WFM layers disposed in the gate void 116 of the long PFET 110.

Figure 14:
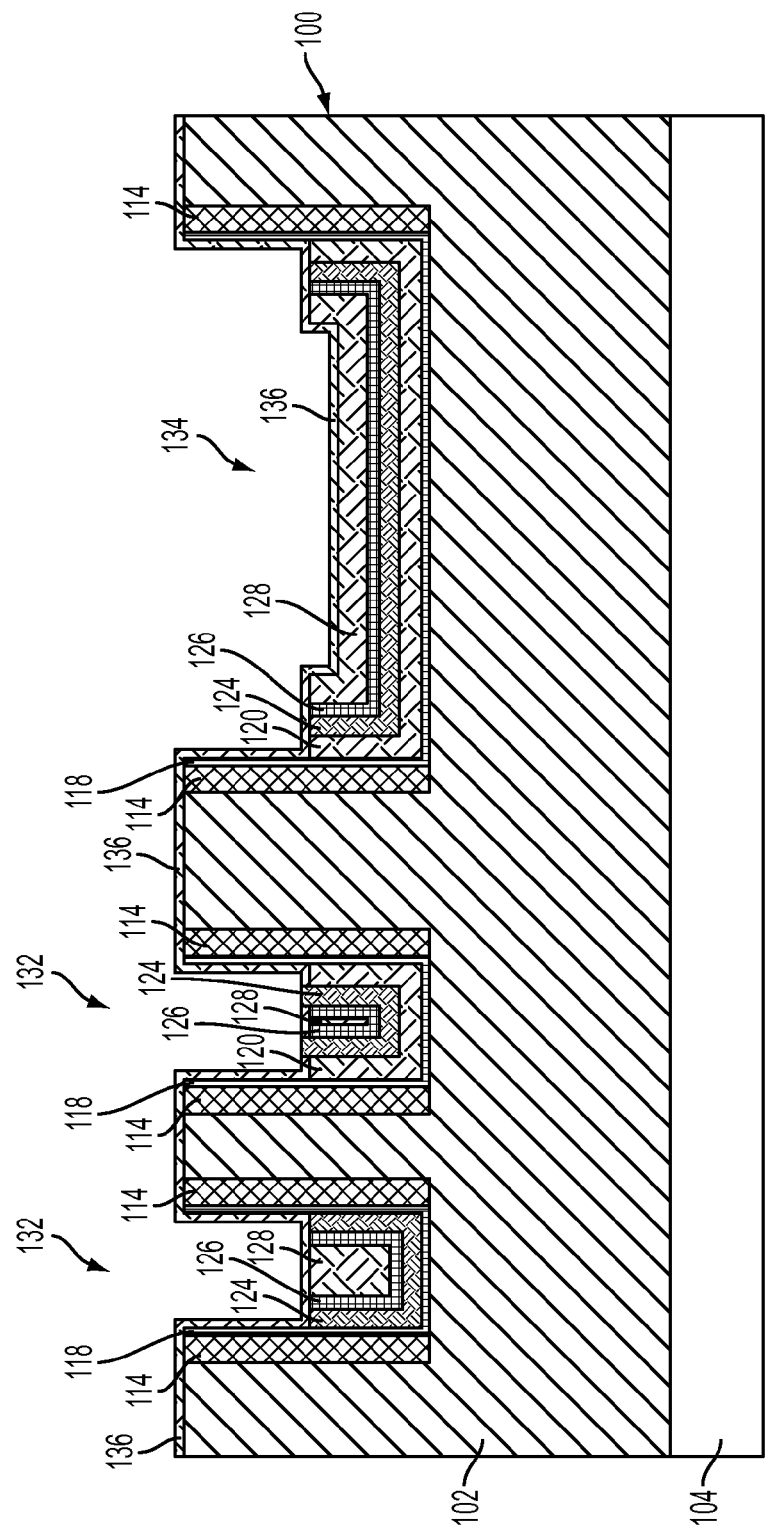
FIG. 14 illustrates the semiconductor substrate of FIG. 13 following deposition of a barrier layer on upper surfaces of the combined work function metal layer remaining in each of the narrow gate channels and the long gate channel and upper surfaces of the semiconductor substrate.

Turning now to FIG. 14, a conformal barrier layer 136 is deposited on upper surfaces of the combined NFET WFM layers and the combined PFET WFM layers disposed in the respective gate channels. The conformal barrier layer 136 extends from the respective combined NFET WFM layers and PFET WFM layers to cover an upper surface of the semiconductor substrate 100 without completely filling the gate voids 116 of the narrow NFET 106, the narrow PFET 108 and the long PFET 110. Accordingly, the gate dielectric layer 118 is interposed between spacers 114 and the conformal barrier layer 136. The conformal barrier layer 136 may be formed from various metal nitride materials including, but not limited to, TiN. Various methods may be used to deposit the conformal barrier layer 136 such as, for example, an ALD process. According to at least one embodiment, at least a portion of the conformal barrier layer 136 is formed directly on the gate dielectric layer 118.

Figure 15:
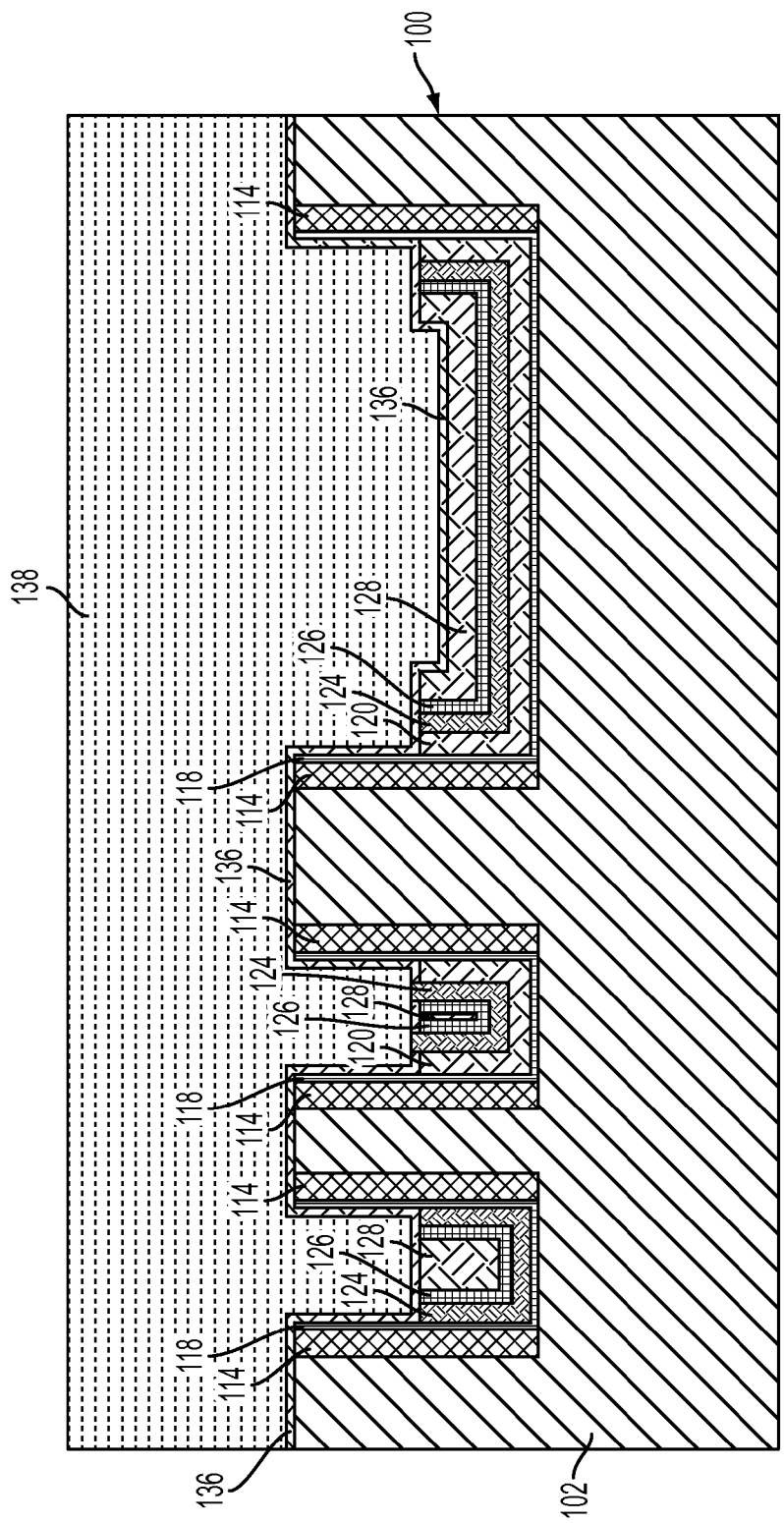
FIG. 15 illustrates the semiconductor substrate of FIG. 14 following deposition of a block metal layer on an upper surface of the semiconductor substrate that fills each of the narrow gate channels and the long gate channel.

Referring to FIG. 15, a block metal layer 138 is deposited that fills each of the gate cavities 132, the trench 134, and that covers the upper surface of the semiconductor substrate 100. The block metal layer 138 may be formed from various metals including, but not limited to, tungsten (W). Accordingly, the conformal barrier layer 136 may serve as barrier between the block metal layer 138 and the gate dielectric layer 118.

Figure 16:
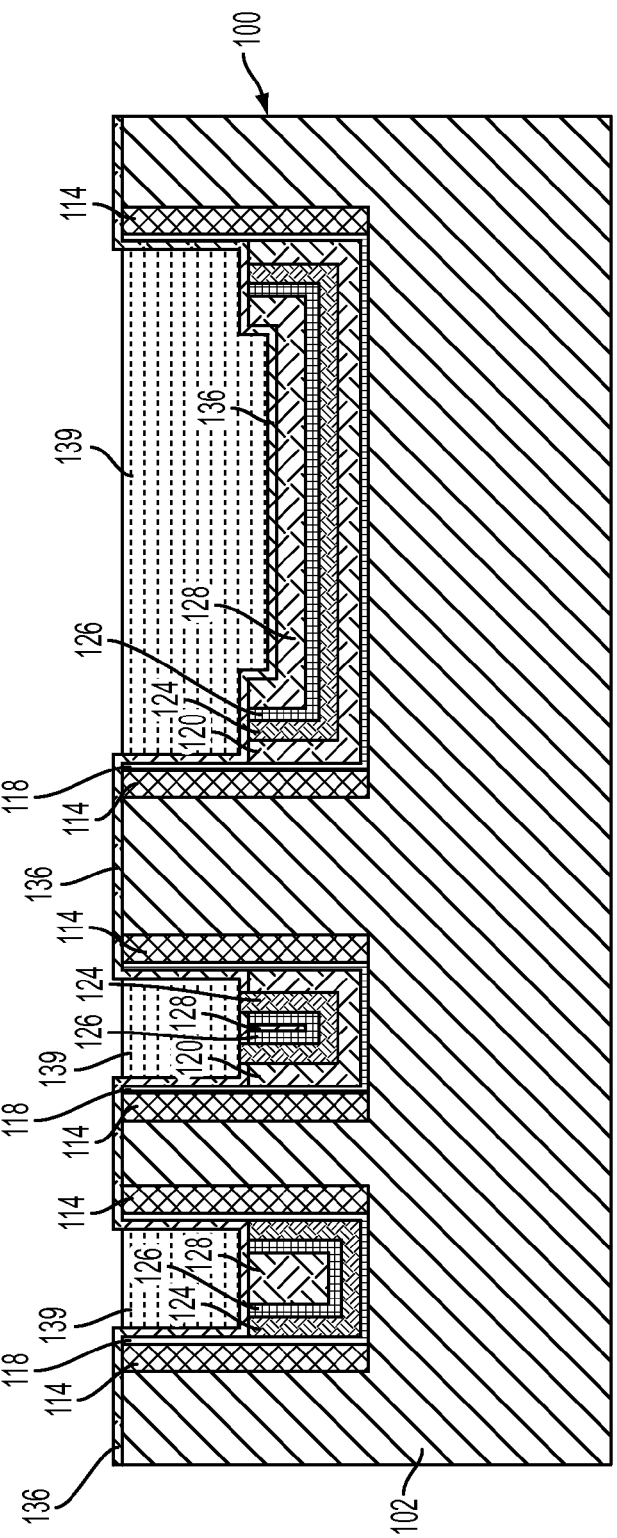
FIG. 16 illustrates the semiconductor substrate of FIG. 15 following a planarization processes that removes the block metal layer from an upper portion of the semiconductor substrate to form metal gate stacks in each of the narrow gate channels and the long gate channel.
Figure 16:
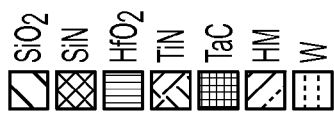

Referring to FIG. 16, the block metal layer 138 may be planarized and removed from an upper portion of the semiconductor substrate 100, while a remaining portion of the block metal layer 138 remains filling each of the narrow gate channels and the long gate channel to form respective metal gate stacks 139. The conformal barrier layer 136 is interposed between each gate stack and the gate dielectric layer 118 as discussed above.

Figure 17:
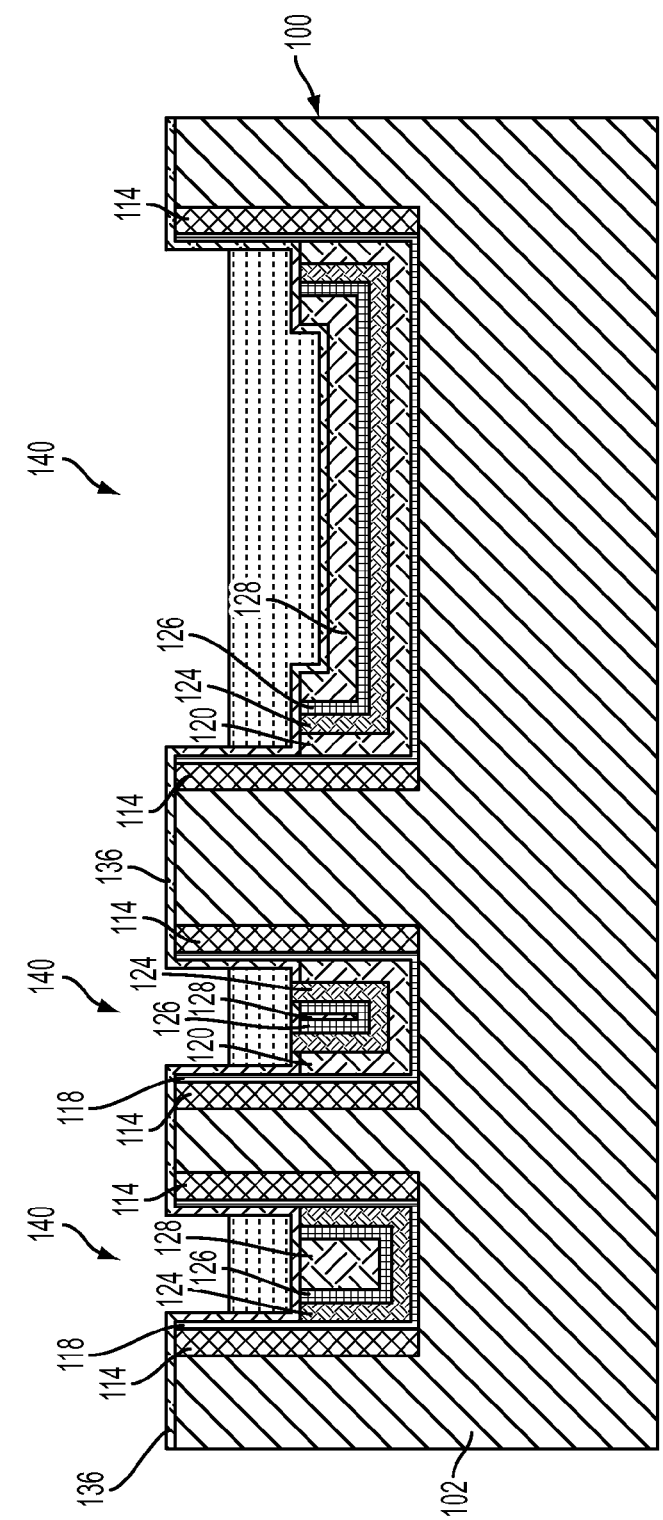
FIG. 17 illustrates the semiconductor substrate of FIG. 16 after etching a portion of the metal gate formed in each of the narrow gate channels and the long gate channel to form respective gate channel cavities.
Figure 17:
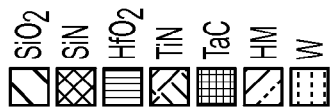

Turning to FIG. 17, the metal gate stacks 139 are partially etched such that a gate channel cavity 140 is formed which exposes a portion of the conformal barrier layer 136 formed on sidewalls of the gate channels. According to at least one exemplary embodiment, an etching process that is selective to nitride material may be used such that the conformal barrier layer 136 may serve to protect the gate dielectric layer 118 from being damaged when etching the metal gate stacks 139. According to another exemplary embodiment, the planarization process may be selective to an oxide material. Accordingly, the conformal barrier layer 136 may be partially etched along with the metal gate stack 139 such that the gate electric layer 118 is exposed.

Figure 18:
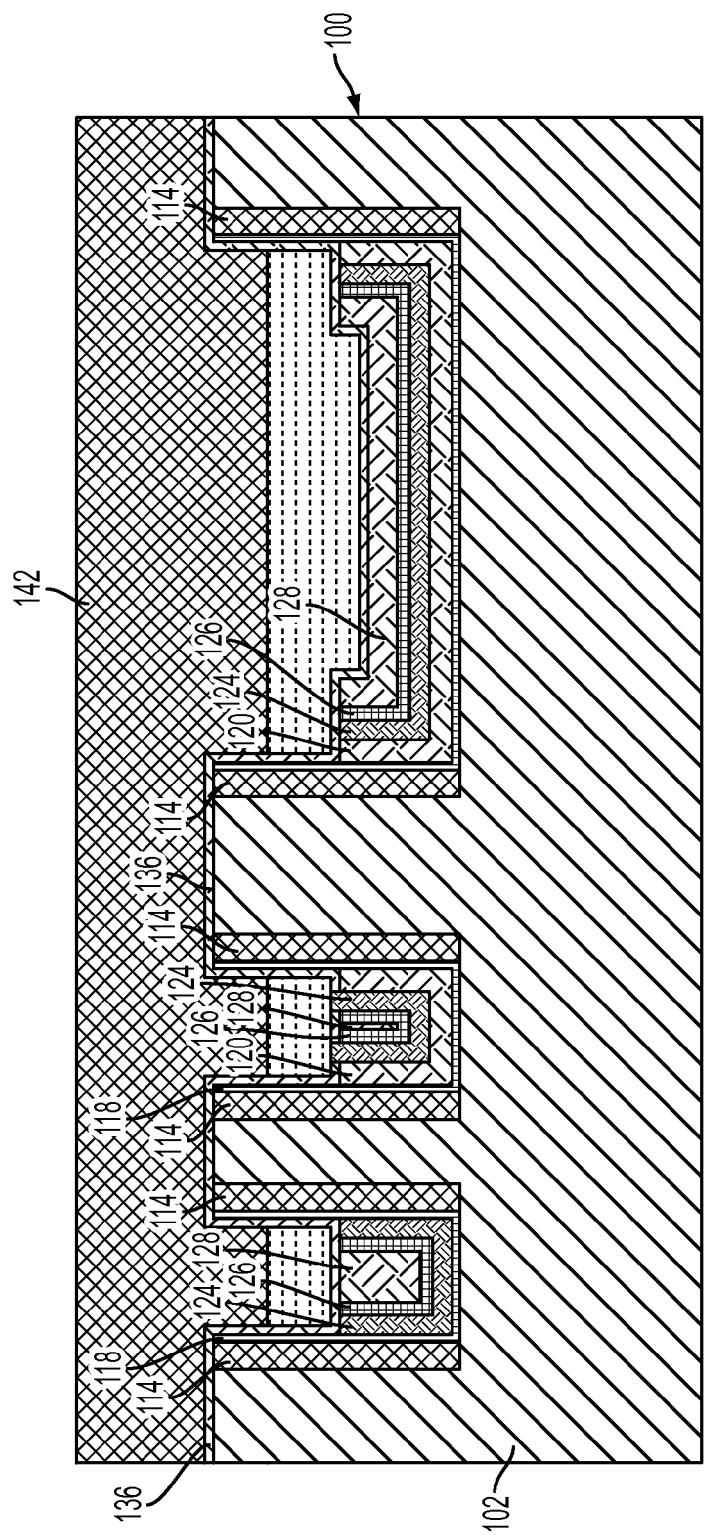
FIG. 18 illustrates the semiconductor substrate of FIG. 17 following deposition of a block hard mask layer in the gate channel cavities and on an upper surface of the semiconductor substrate.

Referring now to FIG. 18, a second block hard mask layer 142 is deposited that covers an upper surface of the semiconductor substrate 100 and fills the gate channel cavities 140. The second block hard mask layer 142 may be formed from various materials including, but not limited to silicon nitride (SiN). Various methods may be used to deposit the second block hard mask layer 142 including, but not limited to, a CVD process.

Figure 19:
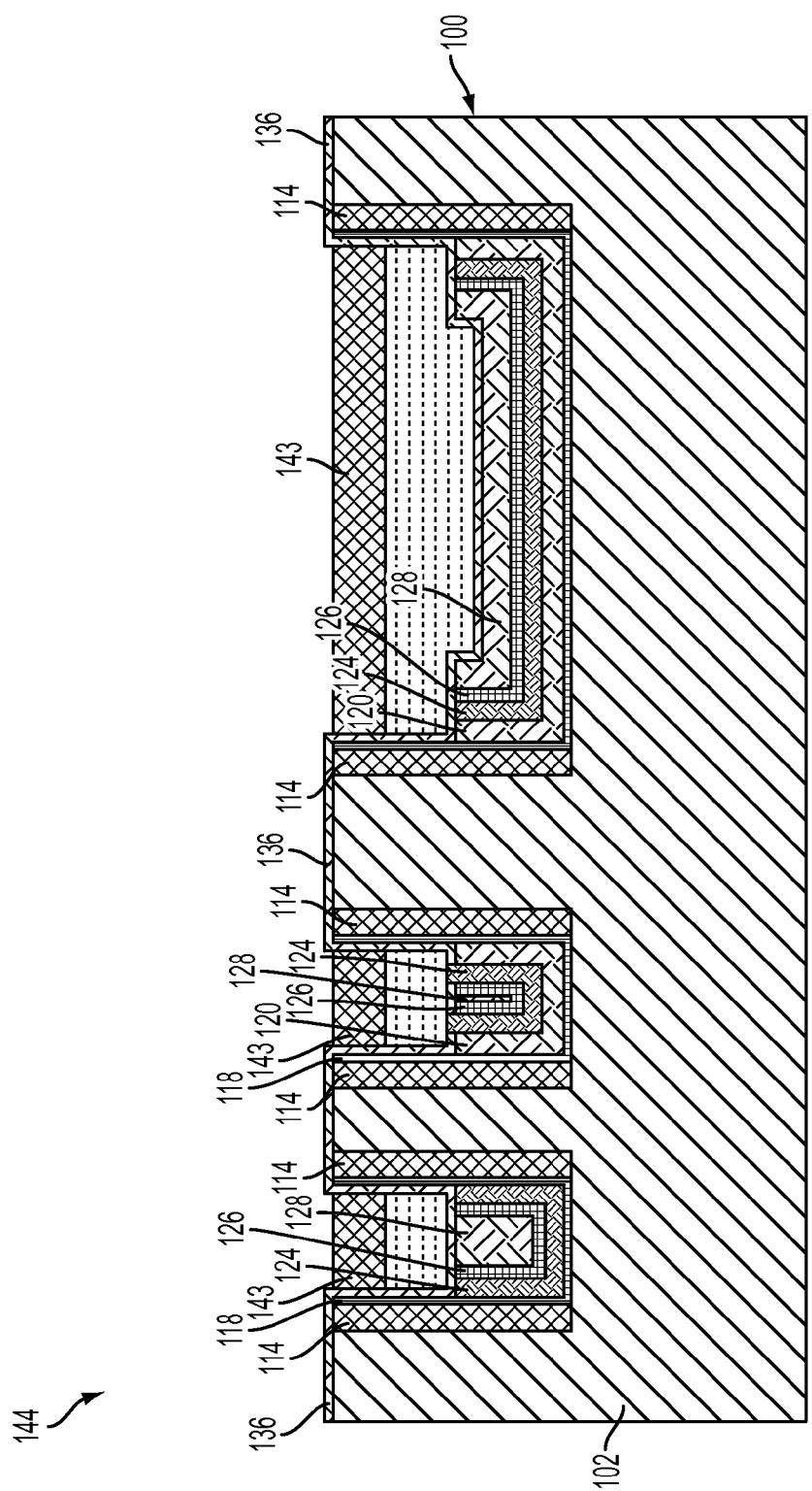
FIG. 19 illustrates the semiconductor substrate of FIG. 18 following a planarization process that removes the block hard mask layer from an upper portion of the semiconductor substrate to form a hard mask on an upper portion of the metal gate stacks in each of the narrow gate channels and the long gate channel.

Turning now to FIG. 19, a planarization process may be applied to the second block hard mask layer 142 while stopping on the conformal barrier layer 136. The second block hard mask layer 142, therefore, may be removed from an upper portion of the semiconductor substrate 100 while gate hard masks 143 remain formed on the upper portion of a respective metal gate stack 139. In addition, a portion of the conformal barrier layer 136 formed on sidewalls of each gate channel is interposed between the gate dielectric layer 118 and the gate hard masks 143.

Figure 20:
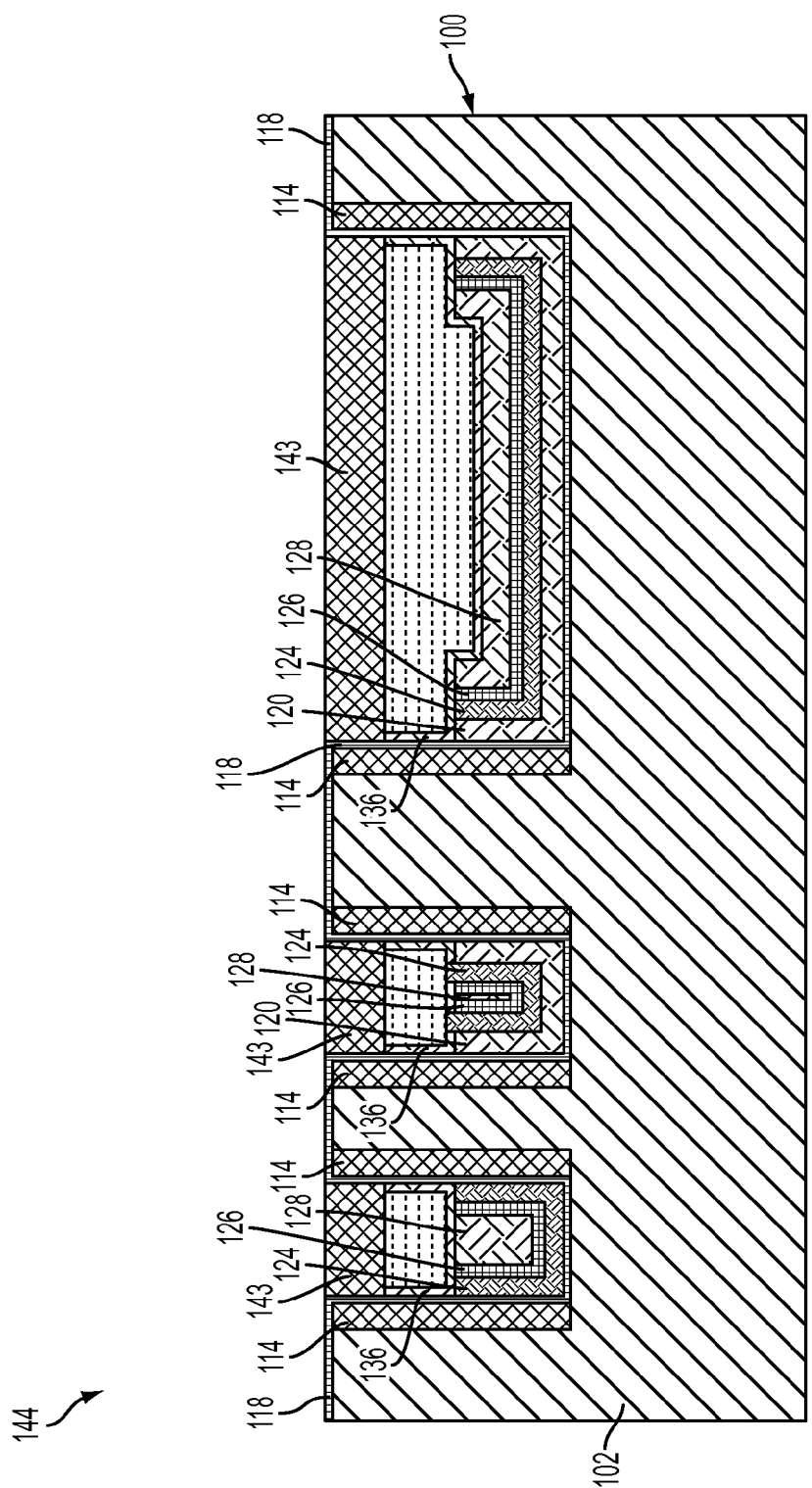
FIG. 20 illustrates an integrated multi-gate length semiconductor device including self-aligned contacts according to an exemplary embodiment.

Accordingly, an integrated multi-gate variable length semiconductor device 144 including self-aligned contacts (SAC) is illustrated in FIG. 19 according to an exemplary embodiment. Based on at least one exemplary process flow described above, the multi-gate variable length semiconductor device 144 may be fabricated to form both a long gate and a narrow gate on a common semiconductor substrate 100 without relying an additional masking layer to form the long gate as required by the conventional process flow. If an etching process that is selective to oxide materials is used such that the conformal barrier layer 136 is partially etched when recessing the metal gate stack 139, then the gate hard mask 143 corresponding to the metal gate stack 139 of the long PFET 110 may formed on an upper surface of the conformal barrier layer 136 and on a surface of the gate dielectric layer 118 as shown in FIG. 20.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

The invention claimed is:

1. A multi-channel semiconductor device, comprising:
 a first gate channel formed in a semiconductor substrate and a second gate channel formed in the semiconductor substrate, the first gate channel having a first length and the second gate channel having a second length greater than the first length;
 a gate dielectric layer formed in the first gate channel and the second gate channel;
 a first plurality of work function metal layers formed on the gate dielectric layer of the first gate channel and a second plurality of work function metal layers formed on the gate dielectric layer of the second gate channel, the second plurality of work function metal layers including a portion of the first plurality of work function metal layers such that the second plurality of work function metal layers has a greater number of layers than the first plurality of work function metal layers;
 a barrier layer formed on each of the first plurality of work function metal layers, the second plurality of work function metal layers and the gate dielectric layer, the second plurality of work function metal layers comprising:
a first work function metal layer formed directly on the gate dielectric layer,
a second work function metal layer formed on the first work function metal layer,
a third work function metal layer formed on the second work function metal layer, and
a fourth work function metal layer formed on the third work function metal layer; and metal gate stacks formed on the barrier layer in each of the first gate channel and the second gate channel, the barrier layer being interposed between the metal gate stacks and the gate dielectric layer.

2. The multi-channel semiconductor device of claim 1, wherein the first plurality of work function metal layers comprises:
the second work function metal layer formed directly on the gate dielectric layer;
the third work function metal layer formed on the second work function metal layer; and
the fourth work function metal layer formed on the third work function metal layer.

3. The multi-channel semiconductor device of claim 2, wherein the second work function metal layer is formed from a metal nitride material and the third work function metal layer is formed from a metal carbide material.

4. The multi-channel semiconductor device of claim 1, wherein the metal gate stacks are formed from tungsten (W).

5. The multi-channel semiconductor device of claim 2, wherein a thickness of the second work function metal layer formed in the first gate channel is less than a combined thickness of the first work function metal layer and the second work function metal layer formed in the second gate channel.

6. The multi-channel semiconductor device of claim 1, wherein the metal gate stack formed in the first gate channel comprises a gate for an n-type field effect transistor (NFET) and the metal gate stack formed in the second gate channel comprises a gate for a p-type field effect transistor (PFET).

7. The multi-channel semiconductor device of claim 1, wherein the metal gate stack formed in the first gate channel comprises a gate for a p-type field effect transistor (PFET) and the metal gate stack formed in the second gate channel comprises a gate for an n-type field effect transistor (NFET).

8. The multi-channel semiconductor device of claim 1, wherein the first work function metal layer is formed from titanium nitride (TiN), the second work function metal layer is formed from titanium nitride (TiN), the third work function metal layer is formed from tantalum carbide (TaC), and the fourth work function metal layer is formed from titanium nitride (TiN).

9. A multi-channel semiconductor device, comprising:
a first gate channel formed in a semiconductor substrate, the first gate channel having a first channel length, a second gate channel formed in the semiconductor substrate, the second gate channel having the first channel length, and a third gate channel formed in the semiconductor substrate, the third gate channel having a second channel length, the second channel length being greater than the first channel length;
a gate dielectric layer formed in the first gate channel, the second gate channel, and the third gate channel;
a first plurality of work function metal layers formed on the gate dielectric layer of the first gate channel and a second plurality of work function metal layers formed on the gate dielectric layer of the second gate channel and the third gate channel, the second plurality of work function metal layers having a greater number of layers than the first plurality of work function metal layers;
a barrier layer formed on each of the first plurality of work function metal layers, the second plurality of work function metal layers, and the gate dielectric layer, the second plurality of work function metal layers comprising:
a first work function metal layer formed directly on the gate dielectric layer,
a second work function metal layer formed on the first work function metal layer,
a third work function metal layer formed on the second work function metal layer, and
a fourth work function metal layer formed on the third work function metal layer; and
metal gate stacks, the barrier layer being interposed between the metal gate stacks and the gate dielectric layer.

10. The multi-channel semiconductor device of claim 9, wherein the metal gate stacks are formed in each of the first gate channel, the second gate channel, and the third gate channel.

11. The multi-channel semiconductor device of claim 10, wherein the metal gate stacks are formed from tungsten (W).

12. The multi-channel semiconductor device of claim 9, wherein the metal gate stack formed in the first gate channel comprises a gate for an n-type field effect transistor (NFET), the metal gate stack formed in the second gate channel comprises a gate for a p-type field effect transistor (PFET), and the metal gate stack formed in the third gate channel comprises a gate for a p-type field effect transistor (PFET).

13. The multi-channel semiconductor device of claim 9, wherein the metal gate stack formed in the first gate channel comprises a gate for a p-type field effect transistor (PFET), the metal gate stack formed in the second gate channel comprises a gate for an n-type field effect transistor (NFET), and the metal gate stack formed in the third gate channel comprises a gate for an n-type field effect transistor (NFET).

14. The multi-channel semiconductor device of claim 9, wherein the first plurality of work function metal layers comprises:
the second work function metal layer formed directly on the gate dielectric layer;
the third work function metal layer formed on the second work function metal layer; and
the fourth work function metal layer formed on the third work function metal layer.

15. The multi-channel semiconductor device of claim 14, wherein a thickness of the second work function metal layer formed in the first gate channel is less than a combined thickness of the first work function metal layer and the second work function metal layer formed in the second gate channel and the third gate channel.

16. The multi-channel semiconductor device of claim 9, wherein the second work function metal layer is formed from a metal nitride material and the third work function metal layer is formed from a metal carbide material.

17. The multi-channel semiconductor device of claim 9, wherein the first work function metal layer is formed from titanium nitride (TiN), the second work function metal layer is formed from titanium nitride (TiN), the third work function metal layer is formed from tantalum carbide (TaC), and the fourth work function metal layer is formed from titanium nitride (TiN).

* * * * *